(12) United States Patent
Li et al.

(10) Patent No.: US 9,866,217 B2
(45) Date of Patent: Jan. 9, 2018

(54) VOLTAGE LEVEL SHIFT CIRCUIT FOR MULTIPLE VOLTAGE INTEGRATED CIRCUITS

(71) Applicant: TAIWAN SEMICONDUCTOR MANUFACTURING COMPANY, LTD., Hsinchu (TW)

(72) Inventors: Bright Li, Jinhua (TW); Yu-Ren Chen, Zhudong Township (TW); Qingchao Meng, Shanghai (CN)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 376 days.

(21) Appl. No.: 14/490,037

(22) Filed: Sep. 18, 2014

(65) Prior Publication Data

US 2015/0002207 A1 Jan. 1, 2015

Related U.S. Application Data

(63) Continuation of application No. 13/905,328, filed on May 30, 2013, now Pat. No. 8,860,489.

(30) Foreign Application Priority Data

Nov. 13, 2012 (CN) .......................... 2012 1 0454657

(51) Int. Cl.
*H03L 5/00* (2006.01)
*H03K 19/0185* (2006.01)
(Continued)

(52) U.S. Cl.
CPC ............ *H03K 19/018528* (2013.01); *H03K 3/356104* (2013.01); *H03K 19/0944* (2013.01); *H03K 19/09421* (2013.01)

(58) Field of Classification Search
None
See application file for complete search history.

(56) References Cited

U.S. PATENT DOCUMENTS 6,011,421 A * 1/2000 Jung .............................. 327/333
6,556,061 B1 * 4/2003 Chen et al. ................... 327/333
(Continued)

FOREIGN PATENT DOCUMENTS

CN 101667824 3/2010

OTHER PUBLICATIONS

Office Action dated Feb. 3, 2016 from corresponding No. CN 201210454657.6.

*Primary Examiner* — Lincoln Donovan
*Assistant Examiner* — Khareem E Almo
(74) *Attorney, Agent, or Firm* — Hauptman Ham, LLP

(57) ABSTRACT

A voltage level shift circuit comprises a first pair of transistors and a second pair of transistors. A first transistor of the second pair of transistors is coupled with an input signal terminal. A second transistor of the transistors of the second pair of transistors is coupled with an inverted input signal terminal. The transistors of the second pair of transistors are cross-coupled with the transistors of the first pair of transistors. The voltage level shift circuit also comprises a third pair of transistors. The transistors of the third pair of transistors are coupled with the transistors of the first pair of transistors and the transistors of the second pair of transistors. A first transistor of the third pair of transistors is directly coupled with an output signal terminal and second transistor of the third pair of transistors is directly coupled with an inverted output signal terminal.

20 Claims, 12 Drawing Sheets

(51) Int. Cl.
*H03K 3/356* (2006.01)
*H03K 19/094* (2006.01)
*H03K 19/0944* (2006.01)

(56) References Cited

U.S. PATENT DOCUMENTS

| | | | |
|---|---|---|---|
| 7,038,521 B2 * | 5/2006 | Cleary et al. | 327/333 |
| 7,102,410 B2 * | 9/2006 | Khan et al. | 327/333 |
| 7,151,400 B2 * | 12/2006 | Chen | 327/333 |
| 7,176,740 B2 * | 2/2007 | Tachibana et al. | 327/333 |
| 8,384,431 B2 * | 2/2013 | Barrow | 326/68 |
| 8,698,542 B1 * | 4/2014 | Pattnayak | 327/333 |
| 2003/0011418 A1 * | 1/2003 | Nishimura et al. | 327/333 |
| 2003/0132779 A1 * | 7/2003 | Yoo et al. | 326/81 |
| 2005/0195012 A1 * | 9/2005 | Sueoka et al. | 327/333 |
| 2005/0237099 A1 * | 10/2005 | Tachibana et al. | 327/333 |
| 2005/0275444 A1 | 12/2005 | Khan et al. | |
| 2005/0285658 A1 * | 12/2005 | Schulmeyer et al. | 327/333 |
| 2005/0285659 A1 * | 12/2005 | Kanno et al. | 327/333 |
| 2006/0012415 A1 | 1/2006 | Chen | |
| 2007/0247210 A1 * | 10/2007 | Maede et al. | 327/333 |
| 2007/0257724 A1 * | 11/2007 | Suzuki | 327/333 |
| 2008/0191777 A1 * | 8/2008 | Lee et al. | 327/333 |
| 2008/0204110 A1 * | 8/2008 | Ishida | 327/333 |
| 2010/0176864 A1 * | 7/2010 | Yoo | 327/333 |
| 2013/0021085 A1 * | 1/2013 | Kumar et al. | 327/333 |
| 2013/0257505 A1 * | 10/2013 | Chiang | 327/333 |

* cited by examiner

VOLTAGE LEVEL SHIFT CIRCUIT FOR MULTIPLE VOLTAGE INTEGRATED CIRCUITS

PRIORITY CLAIM

The present application is a continuation of U.S. application Ser. No. 13/905,328, filed May 30, 2013, which claims the priority of China Patent Application No. 201210454657.6, filed Nov. 13, 2012, in the State Intellectual Property Office of the People's Republic of China (SIPO), the disclosures of which are hereby incorporated herein by reference in their entireties.

BACKGROUND

Many electronic devices, such as desktop computers, laptop computers, tablets and smart phones, etc., employ multiple integrated circuits, often in conjunction with multiple discrete semiconductor devices, to process and store information. Some electronic devices use multiple voltage levels to correspondingly power their multiple integrated circuits and discrete semiconductor devices. Digital communications between different integrated circuits using different voltages currently has a number of shortcomings when connected together directly, including failure to accurately and reliably receive digital data. Voltage level shifters have been used to shift and adapt voltage levels of digital signals between integrated circuits using different voltages to better facilitate communications. Unfortunately, present voltage level shifters have limitations and drawbacks associated with digital communications between integrated circuit devices operating on different voltages.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Semiconductor integrated circuits (ICs) operate internally at a first supply voltage level, e.g., 0.9 volts, and switchably produce digital data signals in a first mode at a second supply voltage level, e.g., 1.8 volts, or in a second mode at a third supply voltage level, e.g., 3.3 volts, for use by other circuits or devices operating at the corresponding supply voltages. Note that the 1.8 volt and 3.3 volt modes described herein correspond to example standard supply voltages used by industry; however, embodiments are not limited to these standard supply voltages or only two modes. One or more embodiments include the use of other supply voltages and the ability to employ additional modes of operation. In at least some embodiments, an additional mode uses a supply voltage of 5.0 volts. In at least some embodiments, signals originally produced at the first supply voltage level are voltage level-shifted to the second supply voltage level or the third supply voltage level to allow ICs operating at different supply voltages to more reliably communicate.

Figure 1:
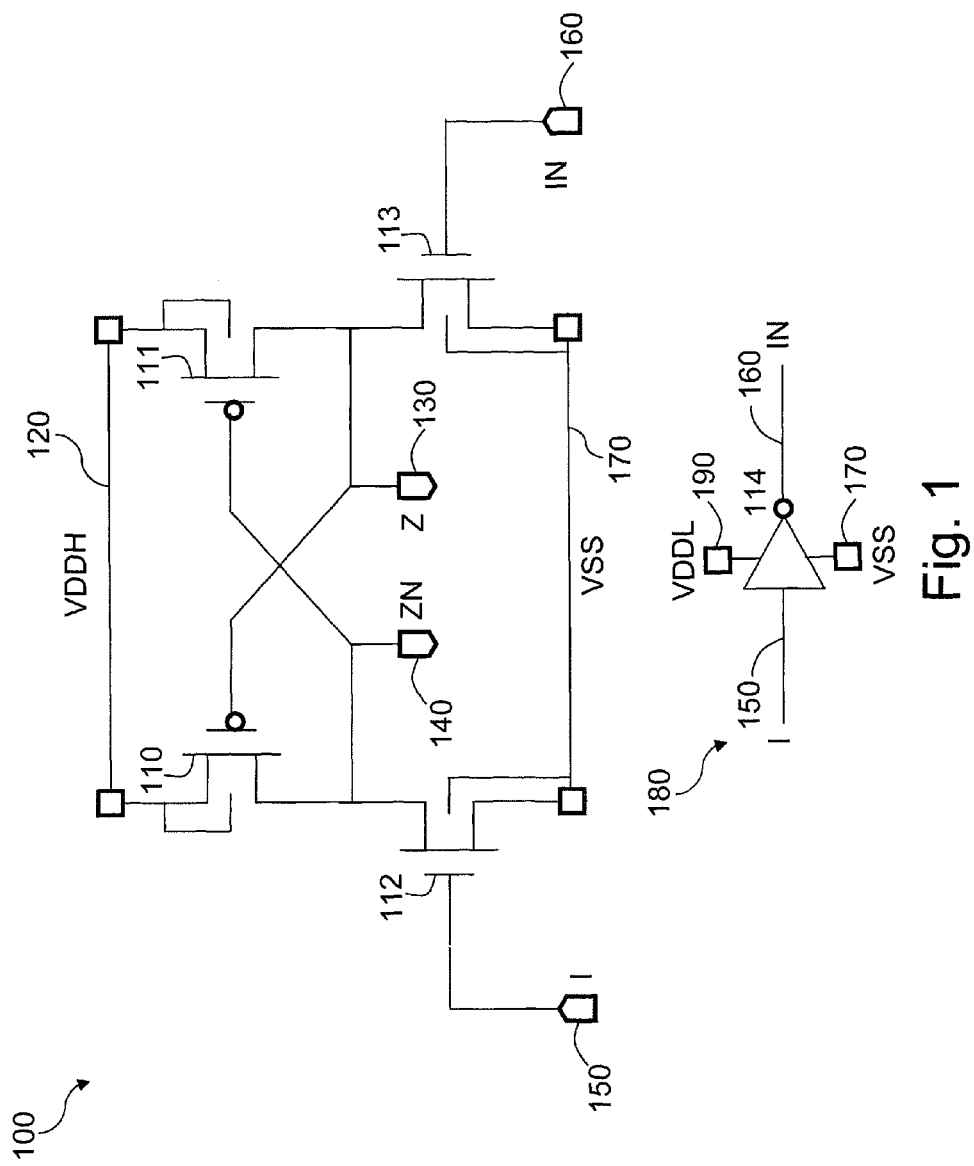
FIG. 1 is a schematic diagram of a voltage level shift circuit.

FIG. 1 is a schematic diagram of a voltage level shift circuit 100 including a PMOS transistor 110 having a source terminal and a substrate voltage bias terminal, and a PMOS transistor 111 having a source terminal and a substrate voltage bias terminal. Both PMOS transistor 110 and PMOS transistor 111 are electrically coupled from the corresponding source terminals and substrate voltage bias terminals to a high supply voltage source VDDH 120 at 3.3 volts. A drain terminal of PMOS transistor 110 is electrically coupled to a drain terminal of an NMOS transistor 112. A drain terminal of PMOS transistor 111 is electrically coupled to a drain terminal of an NMOS transistor 113.

A gate terminal of PMOS transistor 110 is cross-coupled to the drain terminal of PMOS transistor 111, and a gate terminal of PMOS transistor 111 is cross-coupled to the drain terminal of PMOS transistor 110. The gate terminal of PMOS transistor 110 is electrically coupled to an output terminal Z 130. The gate terminal of PMOS transistor 111 is electrically coupled to an inverted output terminal ZN 140. A gate input of NMOS transistor 112 is electrically coupled to an input terminal I 150 and a gate input of NMOS transistor 113 is electrically coupled to an inverted input terminal IN 160. NMOS transistor 112 includes a source terminal and a substrate voltage bias terminal, and NMOS transistor 113 includes a source terminal and a substrate voltage bias terminal. Both NMOS transistor 112 and NMOS transistor 113 are electrically coupled from the corresponding source terminals and substrate voltage bias terminals to ground voltage source VSS 170 at 0 volts.

A portion 180 of voltage level shift circuit 100 includes an inverter 114. The inverter 114 inverts input terminal I 150 to inverted input terminal IN 160. Inverter 114 is electrically coupled to low supply voltage source VDDL 190 at 1.8 volts and ground voltage source VSS 170 at 0 volts.

Figure 2:
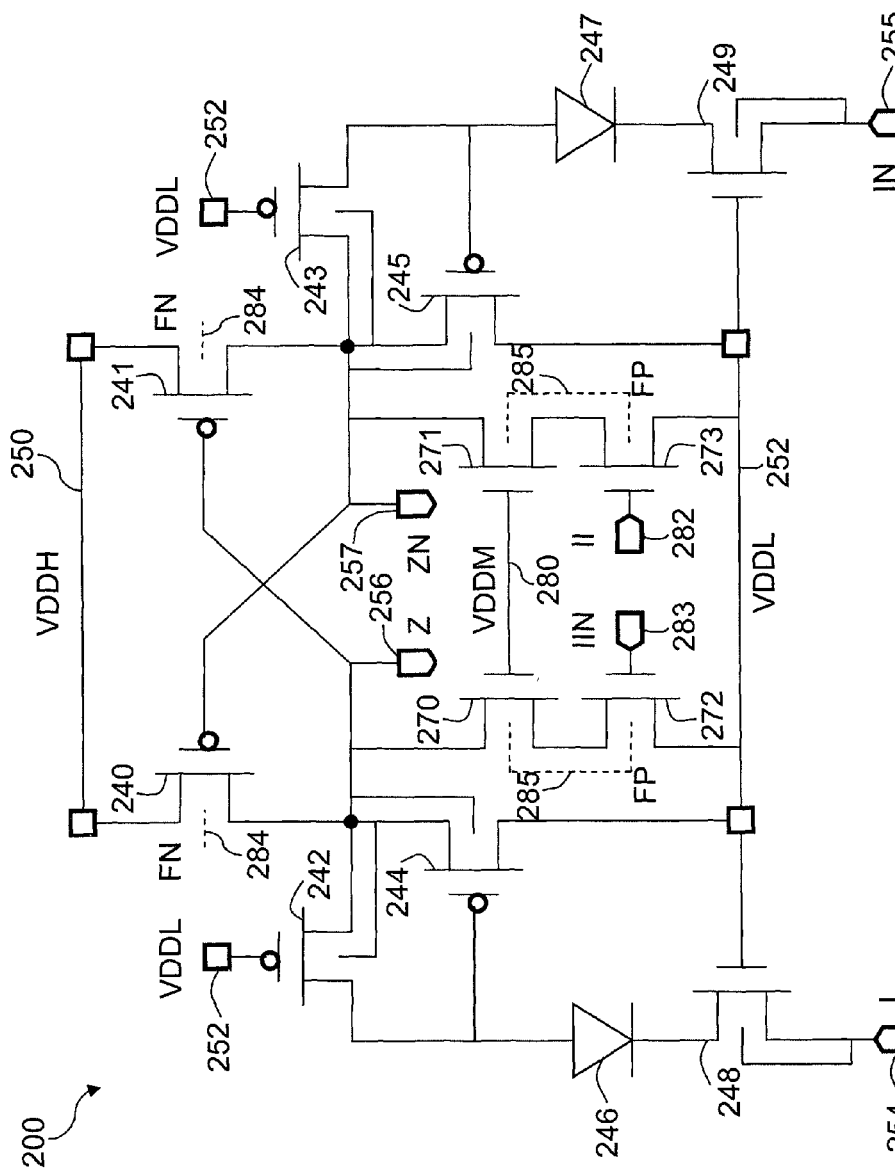
FIG. 2 is a schematic diagram of an over-driver, voltage level shift circuit for multiple voltage integrated circuits in accordance with at least one embodiment.

FIG. 2 is a schematic diagram of an over-driver, voltage level shift circuit 200 for multiple voltage integrated circuits in accordance with at least one embodiment. Voltage level shift circuit 200 comprises a PMOS transistor 240 and a PMOS transistor 241 forming a first pair of transistors, a PMOS transistor 242 and a PMOS transistor 243 forming a second pair of transistors, and a PMOS transistor 244 and a PMOS transistor 245 forming a third pair of transistors. In the first pair of transistors, PMOS transistor 240 has a source terminal electrically coupled to a high supply voltage source VDDH 250 and PMOS transistor 241 has a source terminal electrically coupled to the high supply voltage source VDDH 250. A drain terminal of PMOS transistor 240 is electrically coupled to a drain terminal and a substrate voltage bias terminal of PMOS transistor 242 and to a source terminal of PMOS transistor 244. A drain terminal of PMOS transistor 241 is electrically coupled to a drain terminal and a substrate voltage bias terminal of PMOS transistor 243 and to a source terminal of PMOS transistor 245. A gate terminal of PMOS transistor 240 is electrically cross-coupled to the drain terminal of PMOS transistor 241 and a gate terminal of PMOS transistor 241 is electrically cross-coupled to the drain terminal of PMOS transistor 240.

A source terminal of PMOS transistor 242 is electrically coupled to a gate terminal of PMOS transistor 244 and an input terminal of a diode 246. A source terminal of PMOS transistor 243 is electrically coupled to a gate terminal of PMOS transistor 245 and an input terminal of a diode 247. An output terminal of diode 246 is electrically coupled to a drain terminal of an NMOS transistor 248. An output terminal of diode 247 is electrically coupled to a drain terminal of an NMOS transistor 249. A gate terminal of PMOS transistor 242, a gate terminal of PMOS transistor 243, a gate terminal of NMOS transistor 248 and a gate terminal of NMOS transistor 249 are each electrically coupled to a low supply voltage source VDDL 252. A source terminal and a substrate voltage bias terminal of NMOS transistor 248 are electrically coupled to a first input terminal I 254. A source terminal and a substrate voltage bias terminal of NMOS transistor 249 are electrically coupled to a first inverted input terminal IN 255.

A drain terminal of PMOS transistor 244 and a drain terminal of PMOS transistor 245 are both electrically coupled to low supply voltage source VDDL 252. A substrate voltage bias terminal of PMOS transistor 244 is electrically coupled to the drain terminal of PMOS transistor 240 and an output terminal Z 256. A substrate voltage bias terminal of PMOS transistor 245 is electrically coupled to the drain terminal of PMOS transistor 241 and an inverted output terminal ZN 257.

In some embodiments, the voltage level shift circuit 200 further includes an NMOS transistor 270, an NMOS transistor 271, an NMOS transistor 272 and an NMOS transistor 273. In some embodiments, NMOS transistors 270-273 form a medium voltage portion of the voltage level shift circuit 200. A gate terminal of NMOS transistor 270 and a gate terminal of NMOS transistor 271 are both electrically coupled to a medium supply voltage source VDDM 280. A source terminal of NMOS transistor 270 is electrically coupled to the drain terminal of PMOS transistor 240. A source terminal of NMOS transistor 271 is electrically coupled to the drain terminal of PMOS transistor 241. A drain terminal of NMOS transistor 270 is electrically coupled to a drain terminal of NMOS transistor 272. A drain terminal of NMOS transistor 271 is electrically coupled to a drain terminal of NMOS transistor 273. A source terminal of NMOS transistor 272 and a drain terminal of NMOS transistor 273 are both electrically coupled to the low supply voltage source VDDL 252. A gate terminal of NMOS transistor 273 is electrically coupled to a second input terminal II 282. A gate terminal of NMOS transistor 272 is electrically coupled to a second inverted input terminal IIN 283. The second input terminal II 282 is the same logical value as the first input terminal I 254, but operates at a different voltage operating range. The second inverted input terminal IIN 283 is the same logical value as the first inverted input terminal IN 255, but operates at a different voltage operating range.

Figure 3:
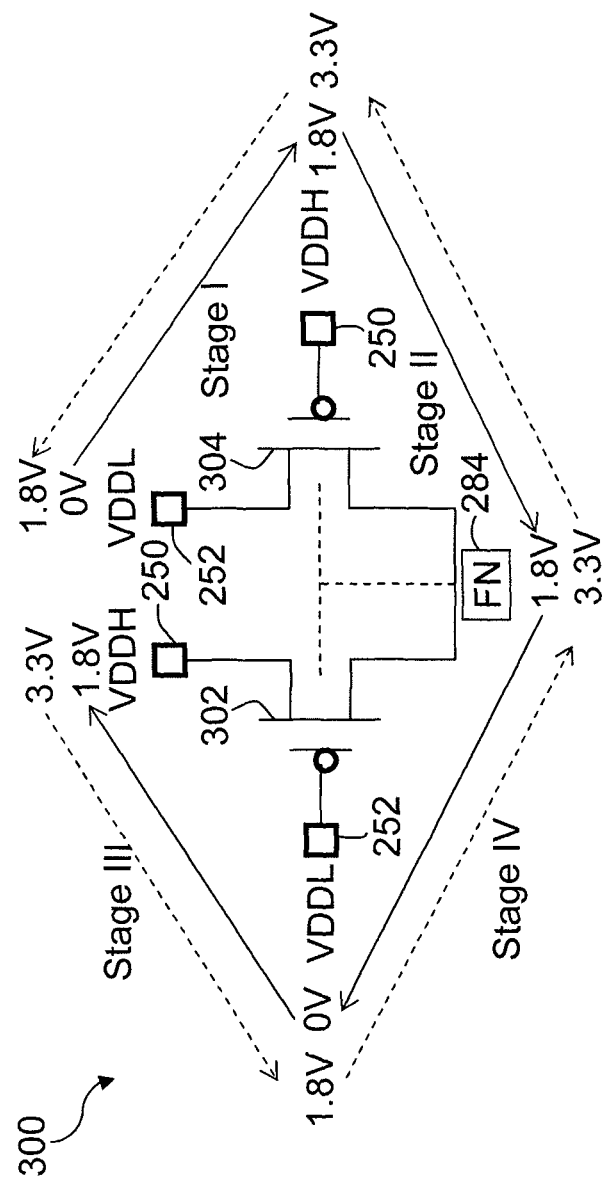
FIG. 3 is a schematic diagram of an over-driver, voltage level shift circuit for multiple voltage integrated circuits in accordance with at least one embodiment.
Figure 4:
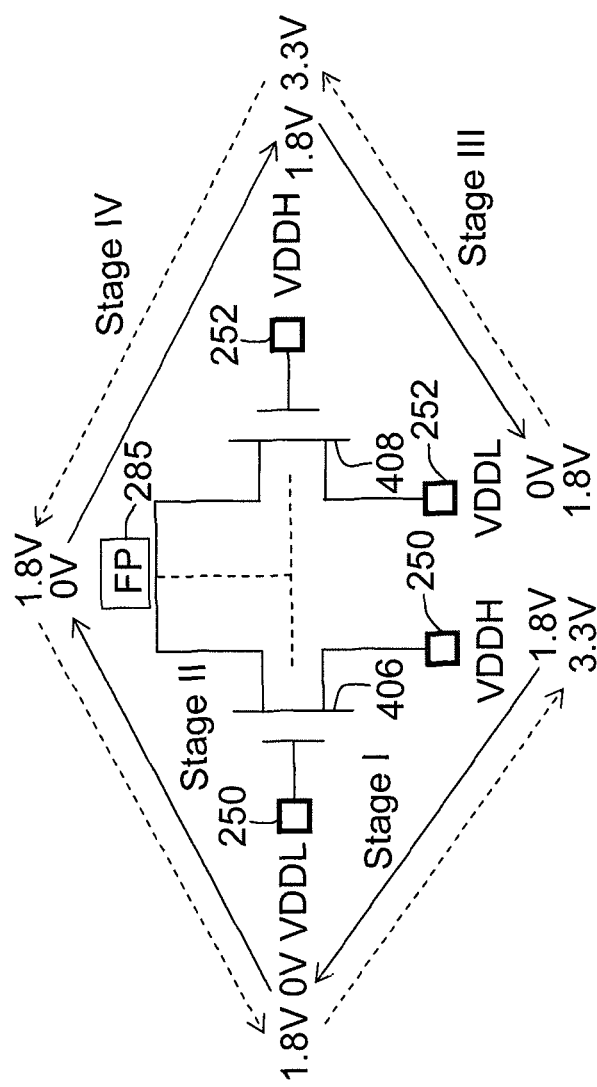
FIG. 4 is a schematic diagram of an over-driver, voltage level shift circuit for multiple voltage integrated circuits in accordance with at least one embodiment.

A substrate voltage bias terminal of PMOS transistor 240 and a substrate voltage bias terminal of PMOS transistor 241 are each electrically coupled to a voltage source terminal FN 284 (FIG. 3). In some embodiments, the substrate voltage bias terminal of PMOS transistor 240 and the substrate voltage bias terminal of PMOS transistor 241 are each electrically coupled to high supply voltage source VDDH 250 instead of voltage terminal FN 284. A substrate voltage bias terminal of NMOS transistor 270, a substrate voltage bias terminal of NMOS transistor 271, a substrate voltage bias terminal of NMOS transistor 272 and a substrate voltage bias terminal of NMOS transistor 273 are each electrically coupled to a voltage terminal FP 285 (FIG. 4). In some embodiments, the substrate voltage bias terminal of NMOS transistor 270, the substrate voltage bias terminal of NMOS transistor 271, the substrate voltage bias terminal of NMOS transistor 272 and the substrate voltage bias terminal of NMOS transistor 273 are each electrically coupled to low supply voltage source VDDL 252 or even the lowest supply voltage such as 0V in some embodiments, instead of voltage terminal FP 285.

The over-driver, voltage level shift circuit 200 enables operation with multiple voltage integrated circuits. Unlike the voltage level shift circuit 100 shown in FIG. 1, the voltage level shift circuit 200 operates at multiple voltages, each a different voltage mode of operation (mode). For example, in some modes, output terminal Z 256 and inverted output terminal ZN 257 are compatible with other circuits supplied with 3.3 volts. The high supply voltage source VDDH 250 is 3.3 volts, the medium supply voltage source VDDM 280 is 1.8 volts, the low supply voltage source VDDL 252 is 1.8 volts, the voltage terminal FN 284 (FIG. 3) is 3.3 volts, the voltage terminal FP 285 (FIG. 4) is 1.8 volts, the first input terminal I 254 and the first inverted input terminal IN 255 range between 0 volts and approximately 1.8 volts, the second input terminal II 282 and the second inverted input terminal IIN 283 range between 0 volts and approximately 0.9 volts. The output terminal Z 256 and the inverted output terminal ZN 257 range between 1.8 volts and approximately 3.3 volts. Because the medium supply voltage source VDDM 280 is at 1.8 volts, the medium voltage portion of the voltage level shift circuit 200 is not electrically active so the first input terminal I 254 and first inverted input terminal IN 255 affect output terminal Z 256 and inverted output terminal ZN 257, but the second input terminal II 282 and the second inverted input terminal IIN 283 do not affect the output terminal Z 256 or the inverted output terminal ZN 257. Thus, and for comparison of modes, input signals from the first input terminal I 254 and first inverted input terminal IN 255 range between 0 volts and approximately 1.8 volts and affect output terminal Z 256 and inverted output terminal ZN 257 that range between 1.8 volts and approximately 3.3 volts.

In another mode, output terminal Z 256 and inverted output terminal ZN 257 of the over-driver, voltage level shift circuit 200 are compatible with other circuits supplied with 1.8 volts. The high supply voltage source VDDH 250 is 1.8 volts, the medium supply voltage source VDDM 280 is 1.8 volts, the low supply voltage source VDDL 252 is 0 volts, the voltage FN 284 (FIG. 3) is 1.8 volts, the voltage terminal FP 285 (FIG. 4) is 0 volts, first input terminal I 254 and first inverted input terminal IN 255 range between 0 volts and approximately 1.8 volts, but the first input terminal I 254 and the first inverted input terminal IN 255 do not affect the output terminal Z 256 or the inverted output terminal ZN 257 as the low supply voltage source VDDL 252 is 0 volts. The second input terminal II 282 and second inverted input terminal IIN 283 range between 0 volts and approximately 0.9 volts. Output terminal Z 256 and inverted output terminal ZN 257 range between 0 volts and approximately 1.8 volts.

The over-driver, voltage level shift circuit 200 selectably operates at different voltages modes. In contrast, the voltage level shift circuit 100 is limited to only one voltage mode of operation, e.g., the voltage level shift circuit 100 does not selectably operate at 1.8 volts or 3.3 volts. Furthermore, in at least some embodiments, the over-driver, voltage level shift circuit 200 uses PMOS transistors for the first, second and third transistor pairs, thereby reducing a need for IC area-consuming electrical isolation between transistor pair wells. In at least some embodiments, the circuitry of the over-driver, voltage level shift circuit 200, in conjunction with the voltages applied, depending on mode, operates faster than the voltage level shift circuit 100. Thus one or more embodiments of the over-driver, voltage level shift circuit 200 mitigate or overcome one or more of a number of drawbacks of the voltage level shift circuit 100 including poor drive capabilities corresponding to slow response times, greater integrated IC area consumed by separated P-well and N-well structures associated with the PMOS and NMOS design, and the limitation to only one voltage mode of operation, i.e., the voltage level shift circuit 100 does not selectably operate at 1.8 volts or 3.3 volts.

FIG. 3 is a schematic diagram of an FN voltage generation circuit 300 portion of the over-driver, voltage level shift circuit 200 in some embodiments. The FN voltage generation circuit 300 generates voltage at the voltage terminal FN 284 (FIG. 2). High supply voltage source VDDH 250 is electrically coupled to a source terminal of a PMOS transistor 302 and a gate terminal of a PMOS transistor 304. Low supply voltage source VDDL 252 is electrically coupled to a source terminal of the PMOS transistor 304 and a gate terminal of the PMOS transistor 302. The voltage terminal FN 284 is electrically coupled to a drain terminal and a substrate bias voltage terminal of the PMOS transistor 302 and to a drain terminal and a substrate bias voltage terminal of the PMOS transistor 304.

In some modes corresponding to dashed arrows between supply voltage sources 250,252 and voltage terminal FN 284, the high supply voltage source VDDH 250 is 3.3 volts, the low supply voltage source VDDL is 1.8 volts and the voltage FN 284 is 3.3 volts. In other modes corresponding to solid arrows between supply voltage source 250,252 and the voltage terminal FN 284, the high supply voltage source VDDH 250 is 1.8 volts, the low supply voltage source VDDL is 0 volts and the voltage terminal FN 284 is 1.8 volts.

FIG. 4 is a schematic diagram of an FP voltage generation circuit 400 portion of the over-driver, voltage level shift circuit 200 in some embodiments. The FP generation circuit 400 generates voltage at the voltage terminal FP 285 (FIG. 2). High supply voltage source VDDH 250 is electrically coupled to a drain terminal of an NMOS transistor 406 and a gate terminal of an NMOS transistor 408. Low supply voltage source VDDL 252 is electrically coupled to a drain terminal of the NMOS transistor 408 and a gate terminal of the NMOS transistor 406. The voltage terminal FP 285 is electrically coupled to a source terminal and a substrate bias voltage terminal of the NMOS transistor 406 and to a source terminal and a substrate bias voltage terminal of the NMOS transistor 408.

In some modes corresponding to dashed arrows between supply voltage sources 250,252 and voltage terminal FP 285, the high supply voltage source VDDH 250 is 3.3 volts, the low supply voltage source VDDL is 1.8 volts and the voltage FP 285 is 1.8 volts. In other modes corresponding to solid arrows between supply voltages sources 250,252 and the voltage terminal FP 285, the high supply voltage source VDDH 250 is 1.8 volts, the low supply voltage source VDDL is 0 volts and the voltage FP 285 is 0 volts.

Figure 5:
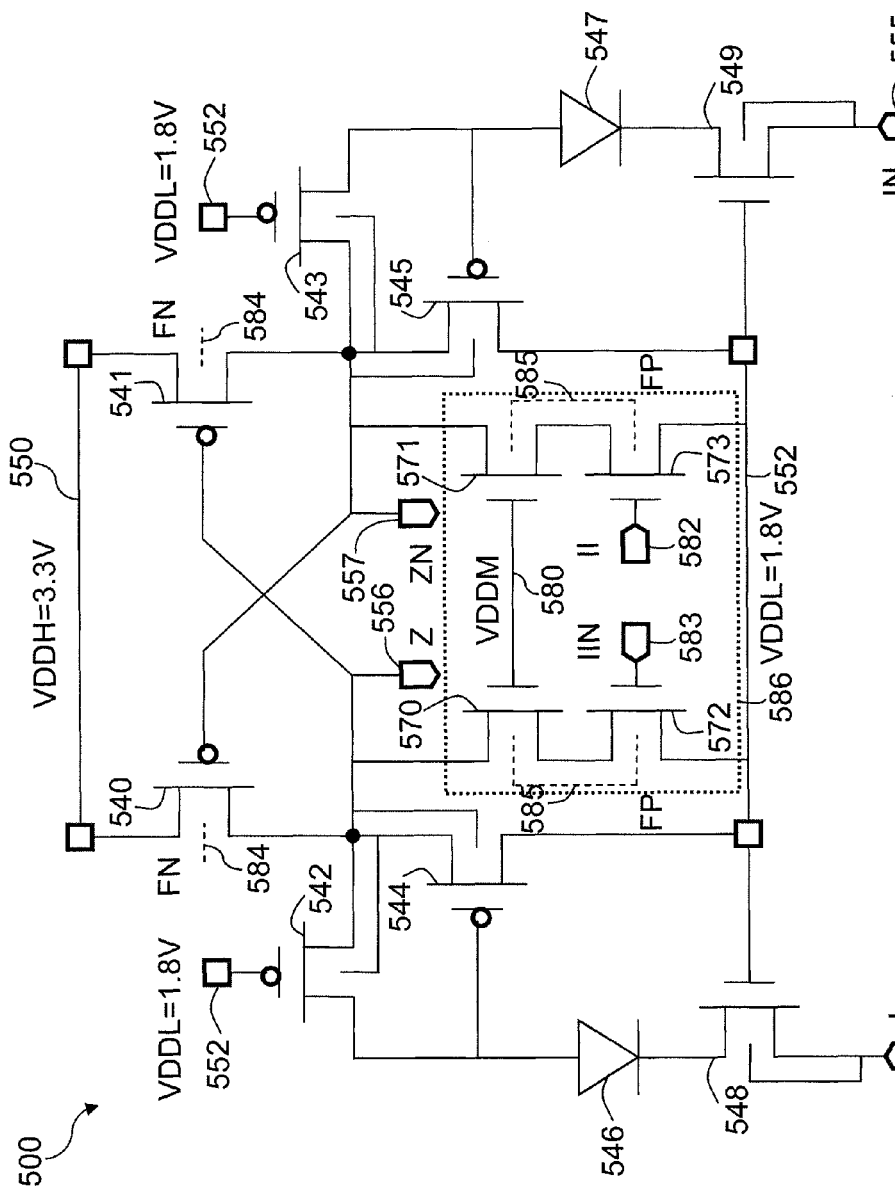
FIG. 5 is a schematic diagram of an over-driver, voltage level shift circuit for multiple voltage integrated circuits in accordance with at least one embodiment.
Figure 6:
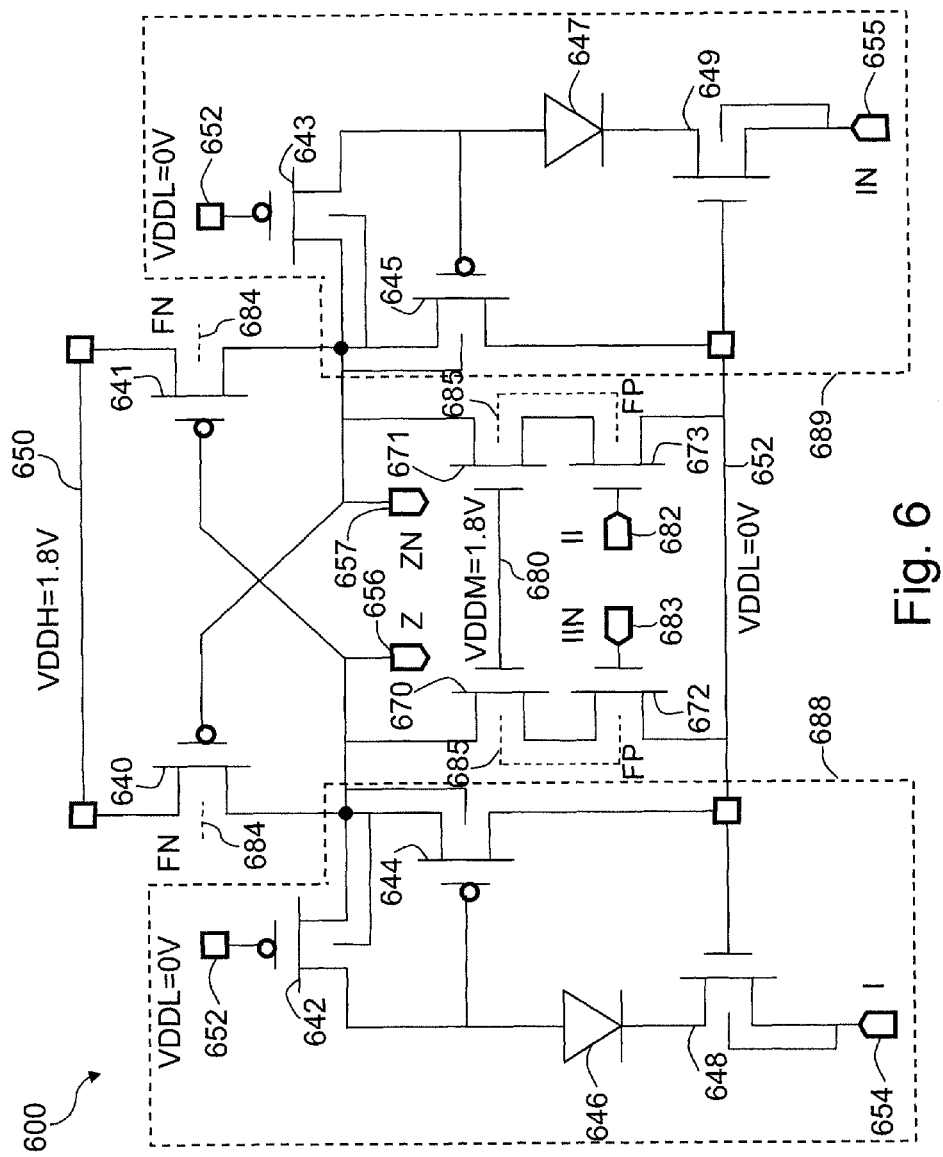
FIG. 6 is a schematic diagram of an over-driver, voltage level shift circuit for multiple voltage integrated circuits in accordance with at least one embodiment.

FIG. 5 and FIG. 6 taken together are schematic diagrams of the over-driver, voltage level shift circuit 200 in different supply voltage modes in some embodiments. Note that if a hundreds digit and thousands digit of a reference numeral in FIG. 2 are correspondingly increased to match the figure number in FIGS. 3-12 and the tens digit and one digit matches a component in FIG. 2, this designates corresponding components, for example, reference numeral 240 in FIG. 2, reference numeral 540 in FIG. 5 and reference numeral 640 in FIG. 6, all designate PMOS transistor 240, 540, 640 in the first transistor pair, thus, except to the extent otherwise indicated, description corresponding to PMOS transistor 240 in FIG. 2 also applies to PMOS transistor 540 in FIG. 5 and PMOS transistor 640 in FIG. 6 and is not repeated for brevity. Thus, FIG. 5 corresponds to FIG. 2, except, an over-driver, voltage level shift circuit 500 in FIG. 5 includes a high supply voltage source VDDH 550 set to 3.3 volts, a low supply voltage source VDDL 552 set to 1.8 volts and a dashed line box appears around the medium voltage portion 586 of the over-driver, voltage level shift circuit 500. In some embodiments the medium voltage portion 586 includes NMOS transistors 570-573.

FIG. 5 is a schematic diagram of an embodiment in which a mode having the high supply voltage source VDDH 550 of 3.3 volts and the low supply voltage source VDDL 552 of 1.8 volts causes the medium voltage portion 586 to be inactive or off.

FIG. 6 corresponds to FIG. 2, except an over-driver, voltage level shift circuit 600 in FIG. 6 includes a high supply voltage source VDDH 650 set to 1.8 volts, a low supply voltage source VDDL 652 set to 0 volts, a medium supply voltage source VDDM 680 set to 1.8 volts and a dashed line box appears around the medium voltage portion 686 of the over-driver, voltage level shift circuit 600. In some embodiments the medium voltage portion 686 includes NMOS transistors 670-673.

FIG. 6 is a schematic diagram of an embodiment in which another mode having a high supply voltage source VDDH 550 of 1.8 volts, a low supply voltage source VDDL 552 of 0 volts, and a medium supply voltage source VDDM 680 set to 1.8 volts, causes the medium voltage portion 586 to be active or on and high voltage portions 688,689 of the over-driver, voltage level shift circuit 600 to inactive or off.

Figure 7:
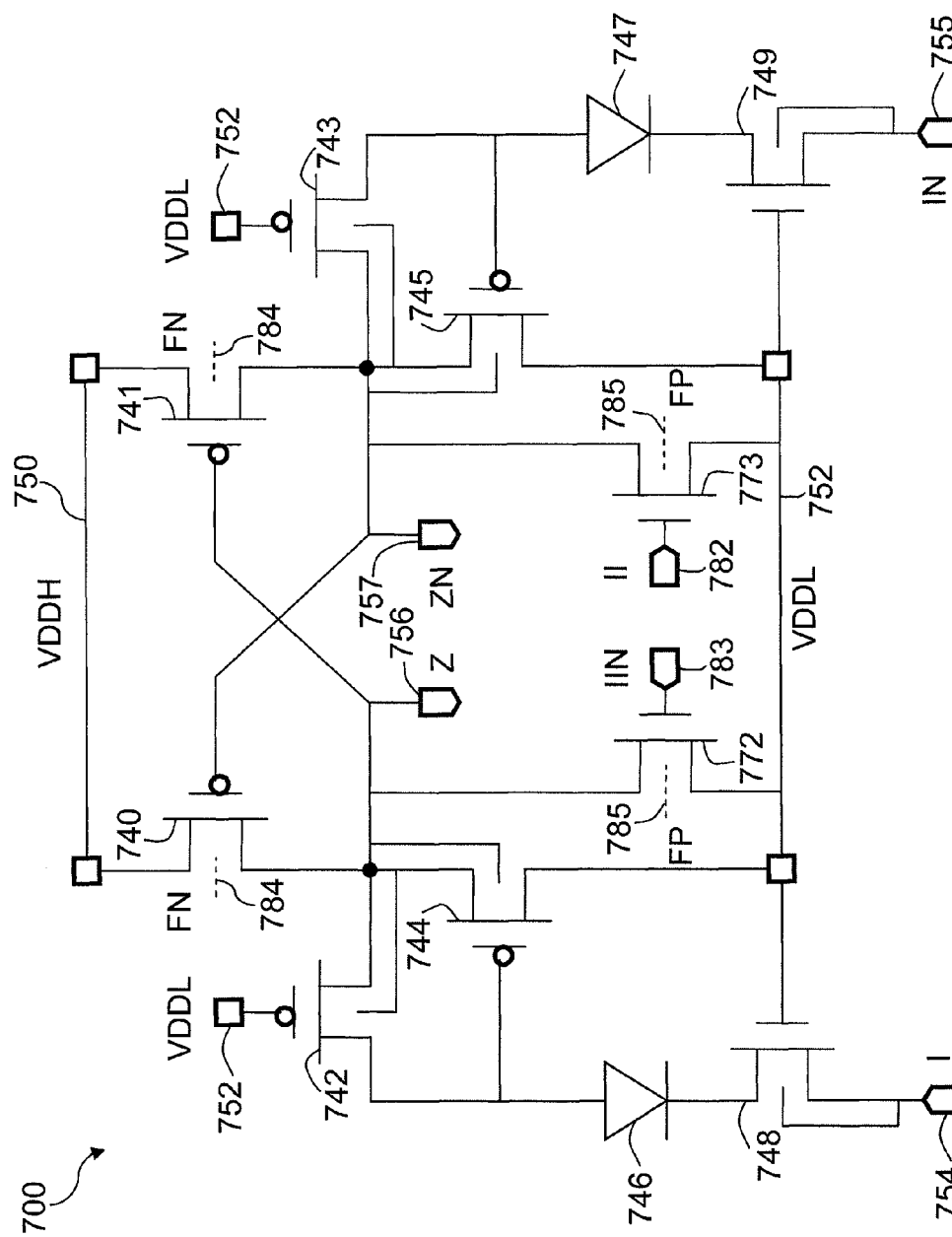
FIG. 7 is a schematic diagram of an over-driver, voltage level shift circuit for multiple voltage integrated circuits in accordance with at least one embodiment.

FIGS. 7-12 are schematic diagrams of other configurations for the over-driver, voltage level shift circuit 200. An over-driver, voltage level shift circuit 700 in FIG. 7 corresponds to FIG. 2, except, the NMOS transistor 270 and the NMOS transistor 271 in FIG. 2 are removed in FIG. 7, and instead a source terminal of a PMOS transistor 744 is electrically coupled to a drain terminal of an NMOS transistor 772 and a source terminal of a PMOS transistor 745 is electrically coupled to a drain terminal of an NMOS transistor 773. In some embodiments, the over-driver, voltage level shift circuit 700 in FIG. 7 is faster in some modes without NMOS transistors 270,271; however, the voltage across NMOS transistors 772, 773 is correspondingly increased, adding electrical stress and heat.

Figure 8:
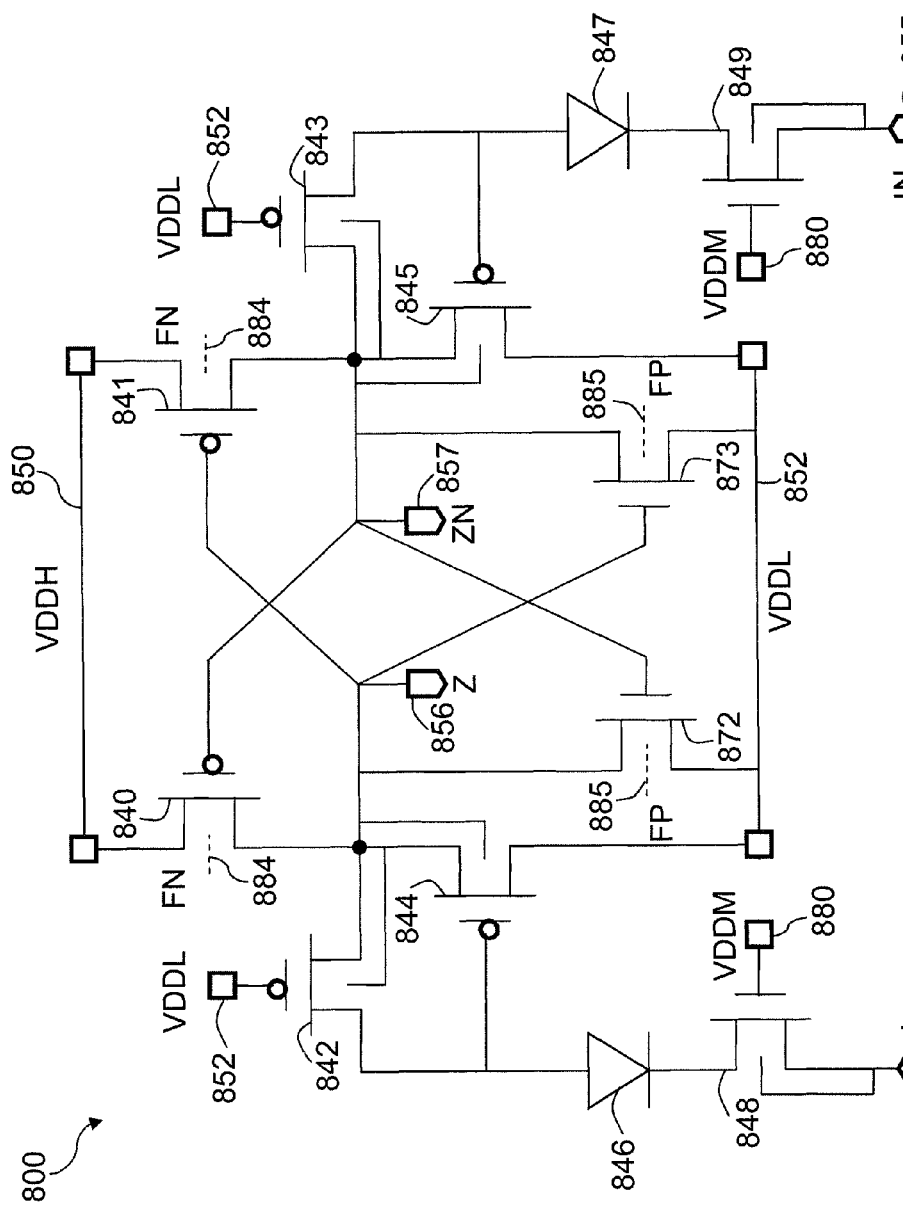
FIG. 8 is a schematic diagram of an over-driver, voltage level shift circuit for multiple voltage integrated circuits in accordance with at least one embodiment.

An over-driver, voltage level shift circuit 800 in FIG. 8 corresponds to FIG. 2, except, NMOS transistor 270 and NMOS transistor 271 in FIG. 2 are removed in FIG. 8, and instead a source terminal of a PMOS transistor 844 is electrically coupled to a drain terminal of an NMOS transistor 872 and a source terminal of a PMOS transistor 845 is electrically coupled to a drain terminal of an NMOS transistor 873. Furthermore, in FIG. 8, but not in FIG. 2, a gate terminal of an NMOS transistor 872 is electrically coupled to inverted output terminal ZN 857, a gate terminal of an NMOS transistor 873 is electrically coupled to output terminal Z 856, a gate terminal of NMOS transistor 848 is electrically coupled to VDDM 880, and a gate terminal of NMOS transistor 849 is electrically coupled to VDDM 880. In some embodiments, the over-driver, voltage level shift circuit 800 in FIG. 8 operates without second input terminal I1 282 and second inverted input terminal I1N 283, the voltage level shift circuit 800 is slower in some modes.

Figure 9:
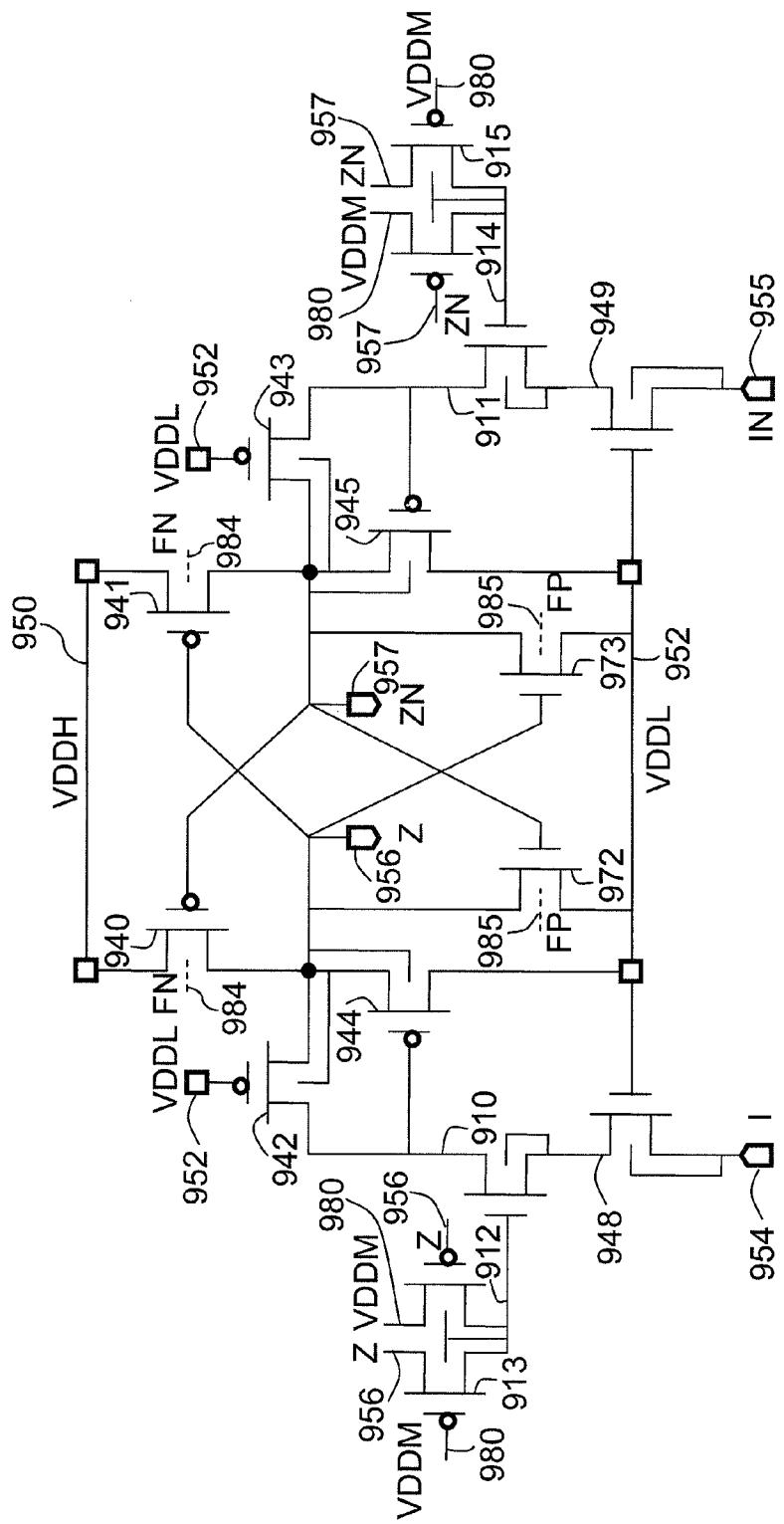
FIG. 9 is a schematic diagram of an over-driver, voltage level shift circuit for multiple voltage integrated circuits in accordance with at least one embodiment.

An over-driver, voltage level shift circuit 900 in FIG. 9 corresponds to FIG. 2, except, NMOS transistor 270, NMOS transistor 271, diode 246 and diode 247 in FIG. 2 are removed in FIG. 9, and instead a source terminal of a PMOS transistor 944 is electrically coupled to a drain terminal of an NMOS transistor 972, a source terminal of a PMOS transistor 945 is electrically coupled to a drain terminal of an NMOS transistor 973. Furthermore, in FIG. 9, but not in FIG. 2, a gate terminal of an NMOS transistor 972 is electrically coupled to inverted output terminal ZN 957, a gate terminal of an NMOS transistor 973 is electrically coupled to output terminal Z 956.

Additionally, and unrelated to FIG. 1, a source terminal of a PMOS transistor 912 is electrically coupled to medium supply voltage source VDDM 980. A source terminal of a PMOS transistor 913 is electrically coupled to output terminal Z 956. A drain terminal and a substrate bias voltage terminal of the PMOS transistor 912 is electrically coupled to a drain terminal and a substrate bias voltage terminal of PMOS transistor 913 and to a gate terminal of an NMOS transistor 910. A gate terminal of PMOS transistor 912 is electrically coupled to output terminal Z 956. A gate terminal of PMOS transistor 913 is electrically coupled to medium supply voltage source VDDM 980. A drain terminal of NMOS transistor 910 is electrically coupled to a source terminal of PMOS transistor 942. A source terminal and a substrate bias terminal of NMOS transistor 910 are electrically coupled to a drain terminal of NMOS transistor 948.

A source terminal of a PMOS transistor 914 is electrically coupled to medium supply voltage source VDDM 980. A source terminal of a PMOS transistor 915 is electrically coupled to inverted output ZN 957. A drain terminal and a substrate bias voltage terminal of the PMOS transistor 914 is electrically coupled to a drain terminal and a substrate bias voltage terminal of PMOS transistor 915 and to a gate terminal of an NMOS transistor 911. A gate terminal of PMOS transistor 914 is electrically coupled to inverted output terminal ZN 957. A gate terminal of PMOS transistor 915 is electrically coupled to medium supply voltage source VDDM 980. A drain terminal of NMOS transistor 911 is electrically coupled to a source terminal of PMOS transistor 943. A source terminal and a substrate bias terminal of NMOS transistor 911 are electrically coupled to a drain terminal of NMOS transistor 949.

In some embodiments, the over-driver, voltage level shift circuit 900 in FIG. 9 operates without second input terminal I1 282 and second inverted input terminal I1N 283 and contains feedback from output terminal Z 956 and inverted output terminal ZN 957 for greater reliability, but the voltage level shift circuit 900 is slower in some modes.

Figure 10:
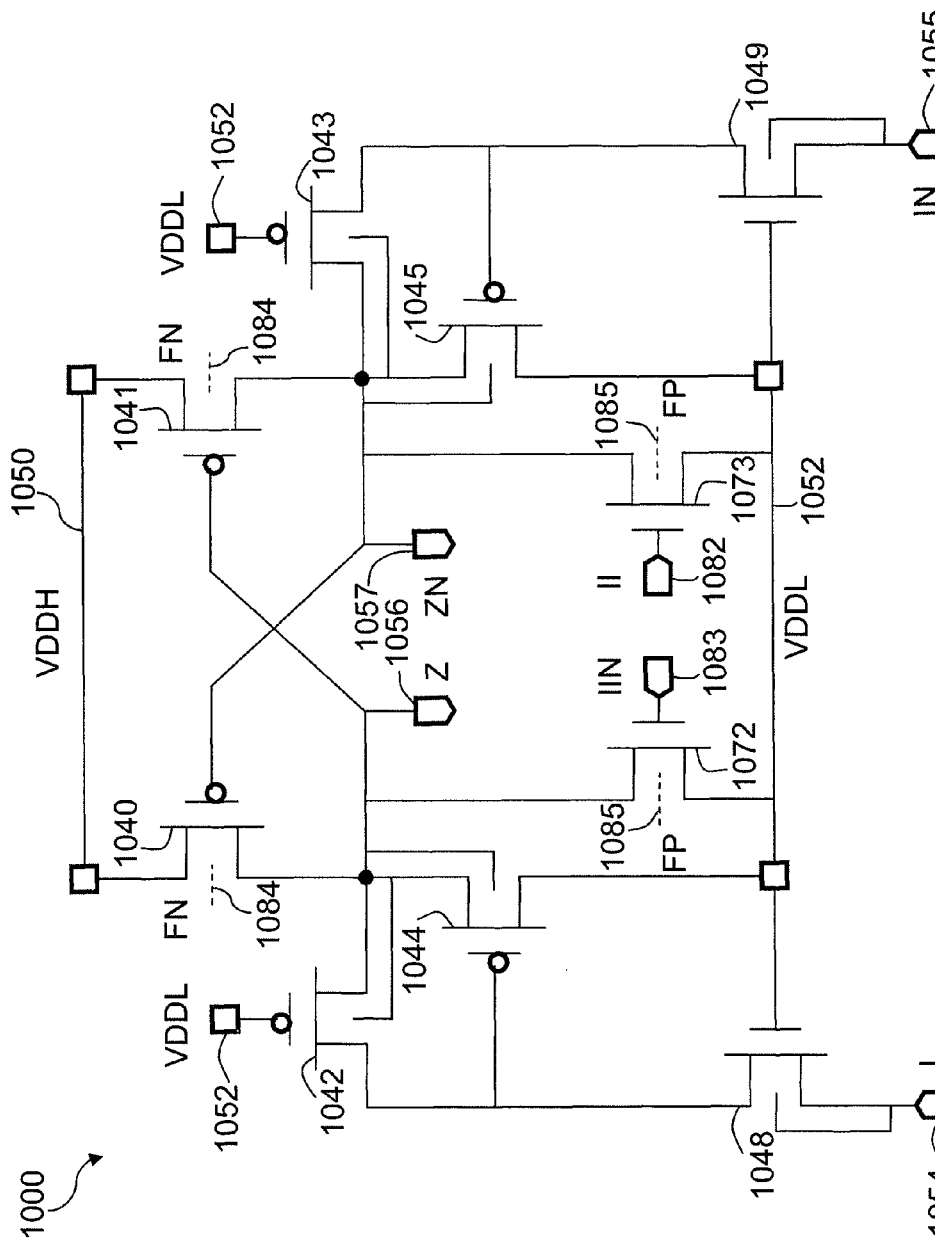
FIG. 10 is a schematic diagram of an over-driver, voltage level shift circuit for multiple voltage integrated circuits in accordance with at least one embodiment.

An over-driver, voltage level shift circuit 1000 in FIG. 10 corresponds to FIG. 2, except, NMOS transistor 270, NMOS transistor 271, diode 246 and diode 247 in FIG. 2 are removed in FIG. 10. However, in FIG. 10 a source terminal of a PMOS transistor 1044 is electrically coupled to a drain terminal of an NMOS transistor 1072, a source terminal of a PMOS transistor 1045 is electrically coupled to a drain terminal of an NMOS transistor 1073, a source terminal of PMOS transistor 1042 is electrically coupled to a drain terminal of NMOS transistor 1048, and a source terminal of PMOS transistor 1043 is electrically coupled to a drain terminal of NMOS transistor 1049. In some embodiments, the over-driver, voltage level shift circuit 1000 in FIG. 10 uses less IC area and components, but is correspondingly less reliable.

Figure 11:
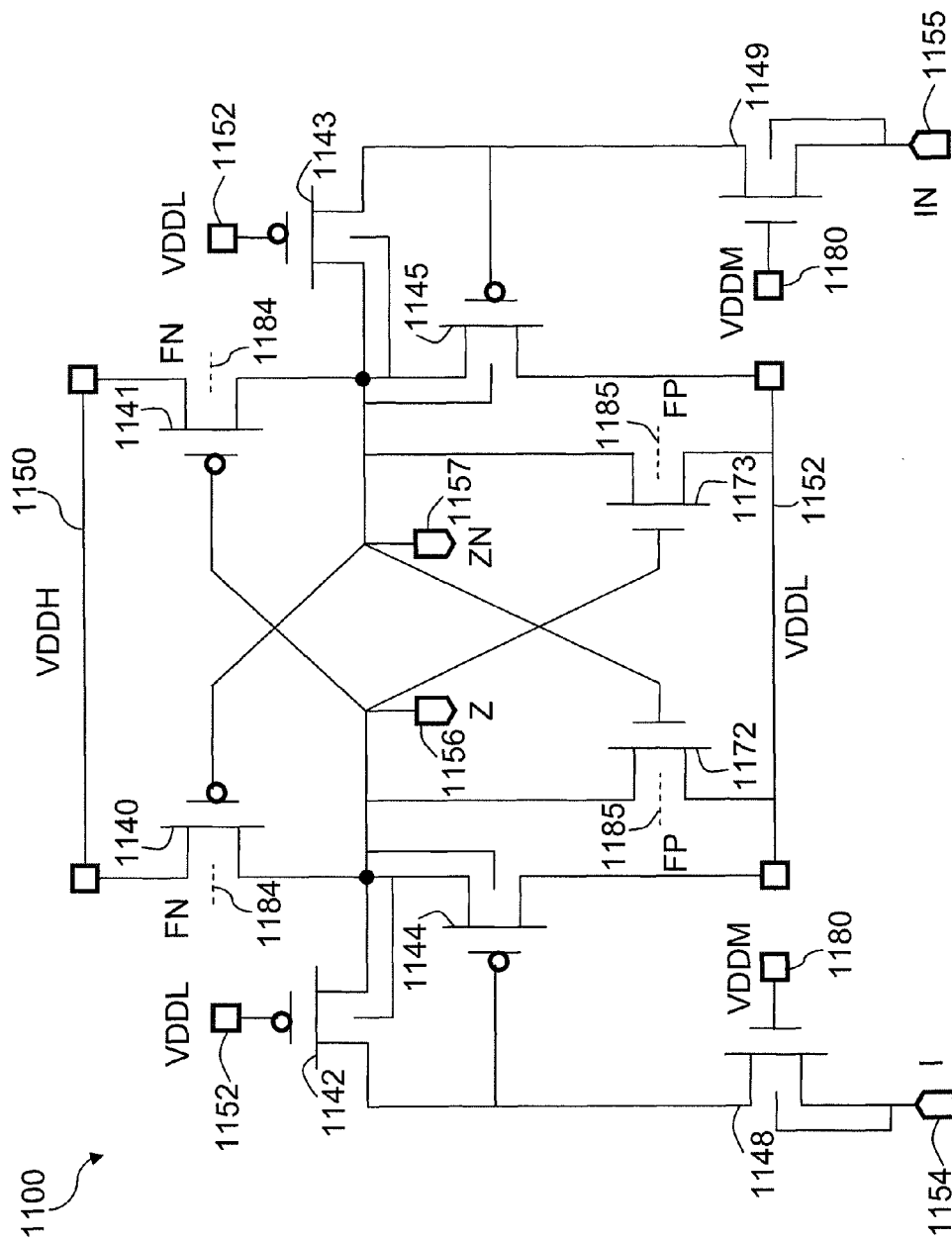
FIG. 11 is a schematic diagram of an over-driver, voltage level shift circuit for multiple voltage integrated circuits in accordance with at least one embodiment.

An over-driver, voltage level shift circuit 1100 in FIG. 11 corresponds to FIG. 2, except, NMOS transistor 270, NMOS transistor 271, diode 246 and diode 247 in FIG. 2 are removed in FIG. 11. However, in FIG. 11 a source terminal of a PMOS transistor 1144 is electrically coupled to a drain terminal of an NMOS transistor 1172, a source terminal of a PMOS transistor 1145 is electrically coupled to a drain terminal of an NMOS transistor 1173, a source terminal of a PMOS transistor 1142 is electrically coupled to a drain terminal of an NMOS transistor 1148, and a source terminal of a PMOS transistor 1143 is electrically coupled to a drain terminal of an NMOS transistor 1149, a gate terminal of an NMOS transistor 1172 is electrically coupled to inverted output terminal ZN 1157, a gate terminal of an NMOS transistor 1173 is electrically coupled to output terminal Z 1156, medium supply voltage source VDDM 1180 is electrically coupled to a gate input of NMOS transistor 1148 and a gate input of NMOS transistor 1149. In some embodiments, the over-driver, voltage level shift circuit 1100 in FIG. 10 uses less IC area and operates without second input I1 282 and second inverted input I1N 283, but is correspondingly slower and less reliable.

Figure 12:
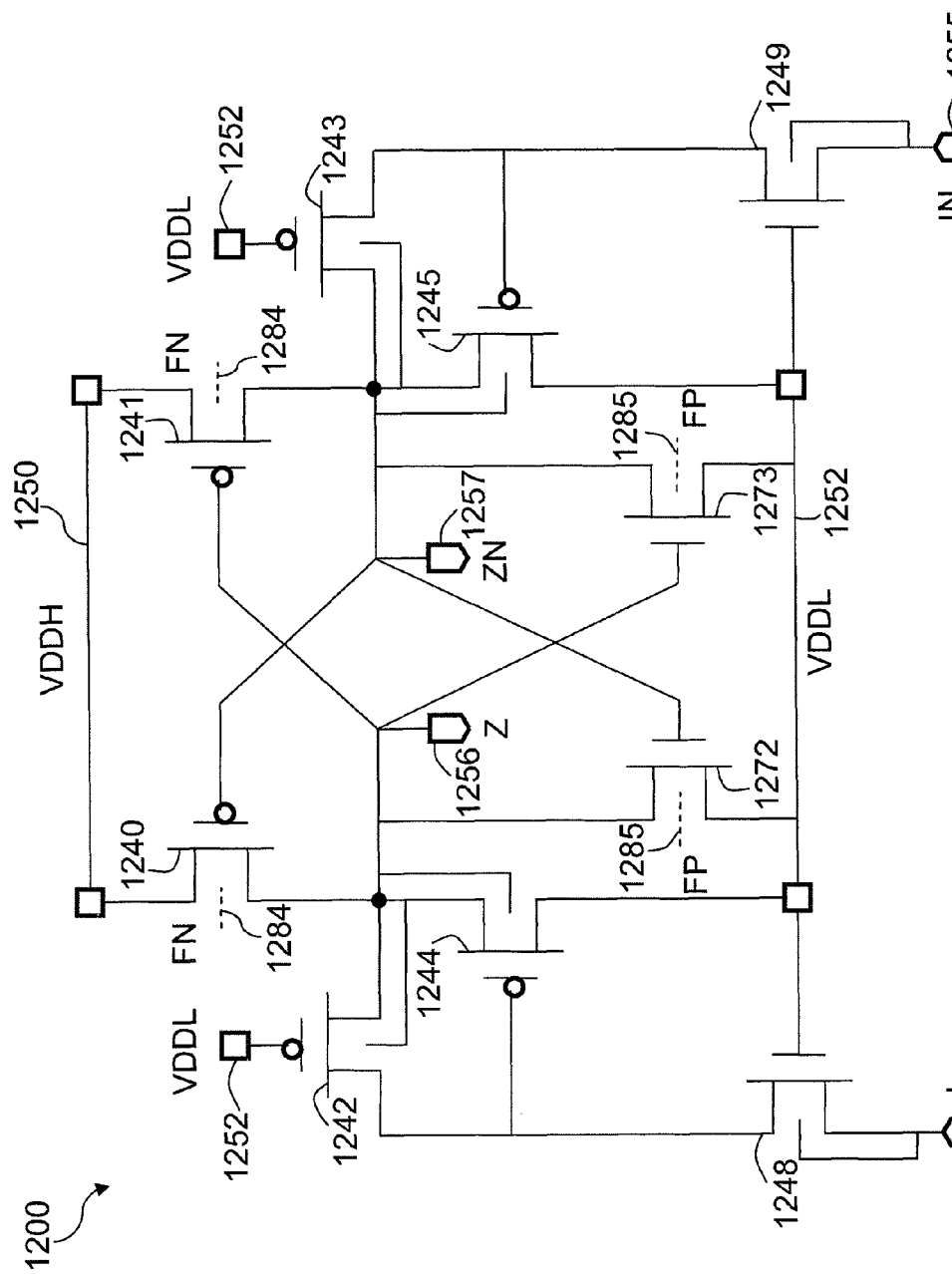
FIG. 12 is a schematic diagram of an over-driver, voltage level shift circuit for multiple voltage integrated circuits in accordance with at least one embodiment.

An over-driver, voltage level shift circuit 1200 in FIG. 12 corresponds to FIG. 2, except, NMOS transistor 270, NMOS transistor 271, diode 246 and diode 247 in FIG. 2 are removed in FIG. 12. However, in FIG. 12 a source terminal of a PMOS transistor 1244 is electrically coupled to a drain terminal of an NMOS transistor 1272, a source terminal of a PMOS transistor 1245 is electrically coupled to a drain terminal of an NMOS transistor 1273, a source terminal of a PMOS transistor 1242 is electrically coupled to a drain terminal of an NMOS transistor 1248, and a source terminal of a PMOS transistor 1243 is electrically coupled to a drain terminal of an NMOS transistor 1249, a gate terminal of an NMOS transistor 1272 is electrically coupled to inverted output terminal ZN 1257, a gate terminal of an NMOS transistor 1273 is electrically coupled to output terminal Z 1256, low supply voltage source VDDL 1252 is electrically coupled to a gate input of NMOS transistor 1248 and a gate input of NMOS transistor 1249. In some embodiments, the over-driver, voltage level shift circuit 1200 in FIG. 12 uses less IC area and operates without second input II 282 and second inverted input IIN 283, but is correspondingly slower and less reliable. Furthermore, medium supply voltage source VDDM 2809 is not needed, but compatibility with circuits employing a medium voltage is correspondingly reduced.

In some embodiments, a voltage level shift circuit is electrically coupled to a high supply voltage source VDDH, a low supply voltage source VDDL and a ground voltage source for use with multiple voltage integrated circuits. The voltage level shift circuit comprises a first pair of transistors. The first pair of transistors has first source or drain (S/D) terminals, second S/D terminals and gate terminals. The first S/D terminals are electrically coupled to VDDH. The voltage level shift circuit comprises a second pair of transistors, each has first S/D terminals, second S/D terminals and gate terminals. One of the first S/D terminals of the second pair of transistors is electrically coupled to an input signal terminal, another of the first S/D terminals of the second pair of transistors is electrically coupled to an inverted input signal terminal. The second S/D terminals of the second pair of transistors are electrically cross-coupled to the gate terminals of the first pair of transistors. The gate terminals of the second pair of transistors are electrically coupled to VDDL. The voltage level shift circuit comprises a third pair of transistors, each has first S/D terminals, second S/D terminals, gate terminals. The first S/D terminals of the third pair of transistors are electrically coupled to the second S/D terminals of the first pair of transistors and the second S/D terminals of the second pair of transistors. The second S/D terminals of the third pair of transistors are electrically coupled to VDDL. One of the first S/D terminals of the third pair of transistors is electrically coupled to an output signal terminal and another of the first S/D terminals of the third pair of transistors is electrically coupled to an inverted output signal terminal.

In some embodiments, a voltage level shift circuit is electrically coupled to a high supply voltage source VDDH, a medium supply voltage source VDDM, a low supply voltage source VDDL and a ground voltage source for use with multiple voltage integrated circuits. The voltage level shift circuit comprising a first pair of transistors. Each of the transistors of the first pair of transistors has a first source or drain (S/D) terminals, second S/D terminals and gate terminals. The first S/D terminals are electrically coupled to VDDH. The voltage level shift circuit comprises a second pair of transistors. Each of the transistors of the second pair of transistors has first S/D terminals, second S/D terminals and gate terminals. One of the first S/D terminals of the second pair of transistors is electrically coupled to a first input signal terminal, another of the first S/D terminals of the second pair of transistors is electrically coupled to a first inverted input signal terminal. The second S/D terminals of the second pair of transistors are electrically cross-coupled to the gate terminals of the first pair of transistors. The gate terminals of the second pair of transistors are electrically coupled to VDDL. The voltage level shift circuit comprises a third pair of transistors, each has first S/D terminals, second S/D terminals and gate terminals. The first S/D terminals of the third pair of transistors are electrically coupled to the second S/D terminals of the first pair of transistors and the second S/D terminals of the second pair of transistors. The second S/D terminals of the third pair of transistors are electrically coupled to VDDL. An output signal terminal is electrically coupled to one of the first S/D terminals of the third pair of transistors and an inverted output signal terminal is electrically coupled to another of the first S/D terminals of the third pair of transistors. The voltage level shift circuit comprises a fourth pair of transistors, each of transistors has first S/D terminals, second S/D terminals and gate terminals. One of the first S/D terminals of the fourth pair of transistors is electrically coupled to the output, another of the first S/D terminals of the fourth pair of transistors is electrically coupled to the inverted output. The gate terminals of the fourth pair of transistors are electrically coupled to VDDM. The voltage level shift circuit comprises a fifth pair of transistors, each of the transistors has first S/D terminals, second S/D terminals and gate terminals. The first S/D terminal of one of the fifth pair of transistors is electrically coupled to the output. The first S/D terminal of another of the fifth pair of transistors is electrically coupled to the inverted output. The gate terminal of one of the fifth pair of transistors is electrically coupled to a second input, the gate terminal of another of the fifth pair of transistors electrically coupled to a second inverted input.

In some embodiments, a method for selecting one of at least two different voltage modes with a voltage level shift circuit is disclosed. The voltage level shift circuit is electrically coupled to a high supply voltage source VDDH, a medium supply voltage source VDDM, a low supply voltage source VDDL. A first pair of input signals has a first voltage operating range. A second pair of input signals has a second voltage operating range. The second voltage operating range is greater than the first voltage operating range. The method comprises selecting a third voltage range from a plurality of different voltage operating ranges different than the first voltage operating range or the second voltage operating range. The method comprises generating an output signal and an inverted output signal. The output signal and the inverted output signal have the third voltage operating range. The method comprises transmitting the output signal or the inverted output signal having the third voltage operating range.

An aspect of this description relates to a voltage level shift circuit. The voltage level shift circuit comprises a first pair of transistors and a second pair of transistors. A first transistor of the second pair of transistors is coupled with an input signal terminal. A second transistor of the transistors of the second pair of transistors is coupled with an inverted input signal terminal. The transistors of the second pair of transistors are cross-coupled with the transistors of the first pair of transistors. The voltage level shift circuit also comprises a third pair of transistors. The transistors of the third pair of transistors are coupled with the transistors of the first pair of transistors and the transistors of the second pair of transistors. A first transistor of the third pair of transistors is directly coupled with an output signal terminal and second transistor of the third pair of transistors is directly coupled with an inverted output signal terminal.

Another aspect of this description relates to a voltage level shift circuit. The voltage level shift circuit comprises a first pair of transistors, wherein the transistors of the first pair of transistors are coupled with a first voltage source. The voltage level shift circuit also comprises a second pair of transistors. A first transistor of the second pair of transistors is coupled with an input signal terminal. A second transistor of the second pair of transistors is coupled with an inverted input signal terminal. The first transistor of the second pair of transistors is cross-coupled with a second transistor of the first pair of transistors. The second transistor of the second pair of transistors is cross-coupled with a first transistor of the first pair of transistors. The transistors of the second pair of transistors are coupled with a second voltage supply configured to supply a voltage greater than the first voltage supply. The voltage level shift circuit further comprises a third pair of transistors. The transistors of the third pair of transistors are coupled with the transistors of the first pair of transistors. The transistors of the third pair of transistors are coupled with the first voltage supply. A first transistor of the third pair of transistors is directly coupled with an output signal terminal or an inverted output signal terminal. A second transistor of the third pair of transistors is directly coupled with the other of the output signal terminal or the inverted output signal terminal.

A further aspect of this description relates to method that comprises generating an output signal and an inverted output signal having a selected voltage operating range from a plurality of different voltage operating ranges using a voltage level shift circuit, the selected voltage operating range being different from a first voltage operating range associated with a first pair of input signals, or a second voltage operating range associated with a second pair of input signals. The second voltage operating range is greater than the first voltage operating range. The method also comprises transmitting the output signal or the inverted output signal having the selected voltage operating range.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A voltage level shift circuit, comprising:
   a first pair of transistors;
   a second pair of transistors, wherein a gate of a first transistor of the second pair of transistors is coupled with an input signal terminal by way of a coupling transistor having a gate coupled with a voltage supply, a second transistor of the second pair of transistors is coupled with an inverted input signal terminal, and the transistors of the second pair of transistors are coupled with the transistors of the first pair of transistors; and
   a third pair of transistors, wherein
      the transistors of the third pair of transistors are coupled with the transistors of the first pair of transistors and the transistors of the second pair of transistors,
      a first transistor of the third pair of transistors is directly coupled with an output signal terminal,
      a second transistor of the third pair of transistors is directly coupled with an inverted output signal terminal, and
      the transistors of the third pair of transistors are configured to electrically isolate the input signal terminal and the inverted input signal terminal from the output signal terminal and the inverted output signal terminal.

2. The voltage level shift circuit of claim 1, wherein the first transistor of the second pair of transistors is coupled with the input signal terminal through a first diode, and the second transistor of the second pair of transistors is coupled with the inverted input signal terminal through a second diode.

3. The voltage level shift circuit of claim 1, wherein the first transistor of the third pair of transistors is coupled with the input signal terminal, and the second transistor of the third pair of transistors is coupled with the inverted input signal terminal.

4. The voltage level shift circuit of claim 1, wherein the transistors of the second pair of transistors have substrate voltage bias terminals electrically coupled with the transistors of the first pair of transistors.

5. The voltage level shift circuit of claim 1, wherein the second transistor of the second pair of transistors is coupled with the inverted input signal terminal through a second coupling transistor.

6. The voltage level shift circuit of claim 1, wherein the input signal terminal has an input voltage range, the output signal terminal has an output voltage range and the input voltage range is less than the output voltage range.

7. A voltage level shift circuit, comprising:
   a first pair of transistors, wherein the transistors of the first pair of transistors are coupled with a first voltage supply, and a gate of at least one of the transistors of the first pair of transistors is coupled with the first voltage supply;
   a second pair of transistors, wherein a first transistor of the second pair of transistors is coupled with an input signal terminal, a second transistor of the second pair of transistors is coupled with an inverted input signal terminal, the first transistor of the second pair of transistors is coupled with a second transistor of the first pair of transistors, the second transistor of the second pair of transistors is coupled with a first transistor of the first pair of transistors, and the transistors of the second pair of transistors are coupled with a second voltage supply configured to supply a voltage less than a voltage of the first voltage supply; and
   a third pair of transistors, wherein
      the transistors of the third pair of transistors are coupled with the transistors of the first pair of transistors,
      the transistors of the third pair of transistors are coupled with the second voltage supply,
      a first transistor of the third pair of transistors is directly coupled with an output signal terminal or an inverted output signal terminal,
      a second transistor of the third pair of transistors is directly coupled with the other of the output signal terminal or the inverted output signal terminal, and
      the transistors of the third pair of transistors are configured to electrically isolate the input signal terminal and the inverted input signal terminal from the output signal terminal and the inverted output signal terminal.

8. The voltage level shift circuit of claim 7, wherein the first voltage supply and the second voltage supply are selected from a plurality of voltage supplies.

9. The voltage level shift circuit of claim 7, wherein the first transistor of the second pair of transistors is coupled with the input signal terminal through a first diode, and the second transistor of the second pair of transistors is coupled with the inverted input signal terminal through a second diode.

10. The voltage level shift circuit of claim 7, wherein the first transistor of the third pair of transistors is coupled with the input signal terminal, and the second transistor of the third pair of transistors is coupled with the inverted input signal terminal.

11. The voltage level shift circuit of claim 7, wherein the transistors of the second pair of transistors have substrate voltage bias terminals coupled with the transistors of the first pair of transistors.

12. The voltage level shift circuit of claim 7, wherein the first transistor of the second pair of transistors is coupled with the input signal terminal through a first coupling transistor, and the second transistor of the second pair of transistors is coupled with the inverted input signal terminal through a second coupling transistor.

13. The voltage level shift circuit of claim 7, wherein the input signal terminal has an input voltage range, the output signal terminal has an output voltage range, and the input voltage range is less than the output voltage range.

14. A method, comprising:
generating, using a voltage level shift circuit, an output signal and an inverted output signal having a selected voltage operating range, wherein
the voltage level shift circuit is configured to receive a plurality of different voltage operating ranges including the selected voltage operating range, and
the selected voltage operating range is different from a first voltage operating range associated with a first pair of input signals, or a second voltage operating range associated with a second pair of input signals, wherein the second voltage operating range is greater than the first voltage operating range; and
transmitting the output signal or the inverted output signal having the selected voltage operating range.

15. The method of claim 14, wherein the selected voltage range is selected by setting voltages for a high supply voltage source VDDH, a medium supply voltage source VDDM, and a low supply voltage source VDDL coupled with the voltage level shift circuit.

16. The method of claim 15, wherein VDDH is greater than VDDM.

17. The method of claim 15, wherein VDDH is greater than VDDL.

18. The method of claim 14, further comprising:
selecting a second selected voltage operating range from the plurality of different voltage operating ranges, wherein the second selected voltage operating range is different than the first voltage operating range and the second voltage operating range and the selected voltage operating range;
generating a second output signal and a second inverted output signal, wherein the second output signal and the second inverted output signal have the second selected voltage operating range; and
transmitting the second output signal or the second inverted output signal.

19. The method of claim 14, wherein the first voltage operating range and the second voltage operating range are pre-defined.

20. The method of claim 19 wherein voltage operating ranges of the plurality of different voltage operating ranges are pre-defined.

* * * * *